(12) United States Patent
Zhong et al.

(10) Patent No.: US 9,397,007 B2
(45) Date of Patent: Jul. 19, 2016

(54) METHOD FOR MANUFACTURING SEMICONDUCTOR STRUCTURE THROUGH FORMING AN ADDITIONAL LAYER INSIDE OPENING OF A PHOTORESIST LAYER

(71) Applicant: Institute of Microelectronics, Chinese Academy of Sciences, Beijing (CN)

(72) Inventors: Huicai Zhong, San Jose, CA (US); Qingqing Liang, Lagrangeville, NY (US); Da Yang, Beijing (CN); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/652,956

(22) PCT Filed: Jul. 26, 2013

(86) PCT No.: PCT/CN2013/080151
§ 371 (c)(1),
(2) Date: Jun. 17, 2015

(87) PCT Pub. No.: WO2014/106376
PCT Pub. Date: Jul. 10, 2014

(65) Prior Publication Data
US 2015/0332973 A1    Nov. 19, 2015

(30) Foreign Application Priority Data

Jan. 6, 2013   (CN) .......................... 2012 1 0543567

(51) Int. Cl.
*H01L 27/088* (2006.01)
*H01L 21/8234* (2006.01)
(Continued)

(52) U.S. Cl.
CPC .. *H01L 21/823437* (2013.01); *H01L 21/26533* (2013.01); *H01L 21/28176* (2013.01);
(Continued)

(58) Field of Classification Search
CPC ................ H01L 21/823437; H01L 21/26533; H01L 21/823468; H01L 27/088; H01L 29/0653; H01L 29/4238
See application file for complete search history.

(56) References Cited

U.S. PATENT DOCUMENTS 5,694,188 A * 12/1997 Sano ................. G02F 1/134363
349/139
7,576,441 B2 * 8/2009 Yin ..................... H01L 21/0332
257/797

(Continued)

FOREIGN PATENT DOCUMENTS

| CN | 102347277 A | 2/2012 |
|---|---|---|
| GB | 2484862 A | 4/2012 |
| TW | 201044439 A1 | 12/2010 |

OTHER PUBLICATIONS

International Search Report mailed Oct. 31, 2013 in International Application PCT/CN2013/080151.

*Primary Examiner* — Caleb Henry
(74) *Attorney, Agent, or Firm* — Pillsbury Winthrop Shaw Pittman LLP (57) ABSTRACT

The present invention provides a method for manufacturing a semiconductor structure, which comprises: a) forming gate lines extending in a direction on a substrate; b) forming a photoresist layer that covers the semiconductor structure; patterning the photoresist layer to form openings across the gate lines; c) narrowing the openings by forming a self-assembly copolymer inside the openings; and d) cutting the gate lines via the openings to make the gate lines insulated at the openings. Through forming an additional layer on the inner wall of the openings of the photoresist layer, the method for manufacturing a semiconductor structure provided by the present invention manages to reduce the distance between the two opposite walls of the openings in the direction of gate width, namely, the method manages to reduce the distance between the ends of electrically isolated gates located on the same line where it is unnecessary to manufacture a cut mask whose lines are extremely fine. Working area is therefore saved, which accordingly improves integration level of semiconductor devices. In addition, the present invention further provides a semiconductor structure according to the method provided by the present invention.

5 Claims, 11 Drawing Sheets (51) Int. Cl.
  *H01L 29/06*   (2006.01)
  *H01L 21/265*   (2006.01)
  *H01L 21/28*   (2006.01)
  *H01L 29/423*   (2006.01)
  *H01L 29/78*   (2006.01)

(52) U.S. Cl.
  CPC .... *H01L21/823468* (2013.01); *H01L 29/0653* (2013.01); *H01L 29/4238* (2013.01); *H01L 27/088* (2013.01); *H01L 29/78* (2013.01)

(56) References Cited

U.S. PATENT DOCUMENTS

| | | | | |
|---|---|---|---|---|
| 7,759,239 B1* | 7/2010 | Lin | ........................ | H01L 21/0337 257/E21.218 |
| 8,105,949 B2* | 1/2012 | Honda | ................ | H01L 21/0212 438/694 |
| 8,124,542 B2* | 2/2012 | Taniguchi | ......... | H01L 21/76224 257/E21.486 |
| 8,361,704 B2* | 1/2013 | Colburn | .............. | B81C 1/00031 430/323 |
| 8,642,483 B2* | 2/2014 | Honda | ................ | H01L 21/0212 257/E21.214 |
| 8,728,945 B2* | 5/2014 | Lytle | ................... | H01L 21/0337 257/E21.249 |
| 8,883,648 B1* | 11/2014 | Hsieh | ................ | H01L 21/76802 257/E23.011 |
| 8,946,806 B2* | 2/2015 | Tan | ................... | H01L 27/11521 257/314 |
| 8,975,188 B2* | 3/2015 | Hirayama | ......... | H01J 37/32082 438/459 |
| 2006/0068592 A1* | 3/2006 | Dostalik | ........... | H01L 21/02063 438/706 |
| 2008/0164558 A1* | 7/2008 | Yang | ................ | H01L 21/76283 257/506 |
| 2009/0068826 A1* | 3/2009 | Taniguchi | ........ | H01L 21/76224 438/585 |
| 2009/0079005 A1* | 3/2009 | Haffner | ............. | H01L 21/28123 257/368 |
| 2009/0191711 A1* | 7/2009 | Rui | ........................... | G03F 7/40 438/695 |
| 2010/0178615 A1* | 7/2010 | Colburn | ............. | B81C 1/00031 430/323 |
| 2012/0153124 A1* | 6/2012 | Yu | ..................... | H01L 27/14607 250/208.1 |
| 2014/0220767 A1* | 8/2014 | Hu | ................... | H01L 29/66545 438/585 |

* cited by examiner

METHOD FOR MANUFACTURING SEMICONDUCTOR STRUCTURE THROUGH FORMING AN ADDITIONAL LAYER INSIDE OPENING OF A PHOTORESIST LAYER

CROSS REFERENCE TO RELATED APPLICATION

This application is a national stage application, filed under 35 U.S.C. §371, of PCT Application No. PCT/CN2013/080151, filed on Jul. 26, 2013, entitled "SEMICONDUCTOR STRUCTURE AND METHOD FOR MANUFACTURING THE SAME", which claimed priority to Chinese Application No. 201210543567.4, filed on Jan. 6, 2013, all of which are hereby incorporated by reference in their entirety.

FIELD OF THE INVENTION

The present invention relates to the technical field of semiconductor manufacturing, particularly, to a semiconductor structure and a method for manufacturing the same.

BACKGROUND OF THE INVENTION

With development of the semiconductor structure manufacturing technology, integrated circuits with better performance and more powerful functions require greater element density, and the size of the elements and the spacing among the elements need to be further downscaled. As a result, the technique of lithography is facing more rigid requirements and challenges in the process of manufacturing semiconductor structures. Particularly, in manufacturing chips of static random access memories (SRAM), the Line-and-Cut dual patterning technology is usually applied to form gates in semiconductor structures. Here below, application of this technology in the prior art is to be described in conjunction with FIG. 1 to FIG. 4.

Figure 1:
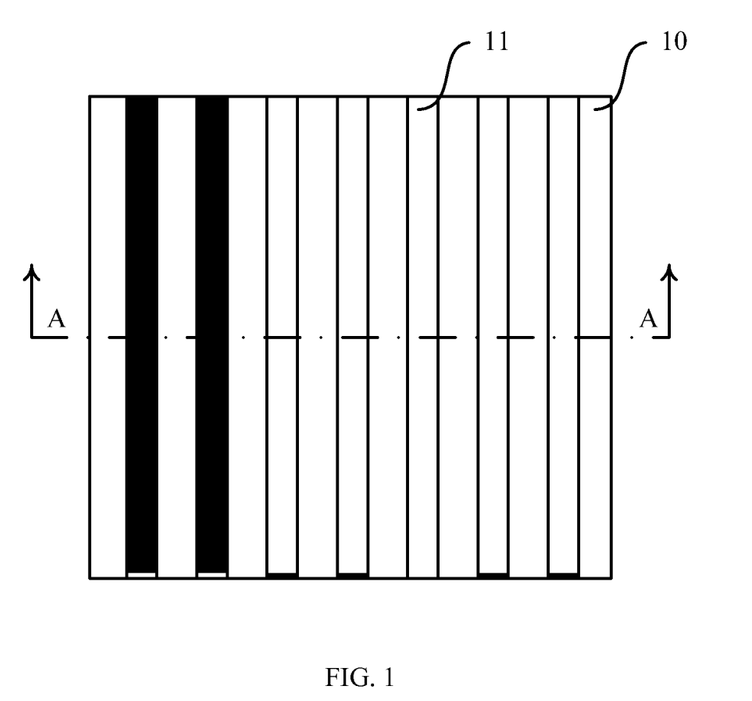
FIG. 1 to FIG. 4 illustrate bird's-eye views of the semiconductor structure at respective stages in the process of forming gates of a semiconductor in the prior art.
Figure 2:
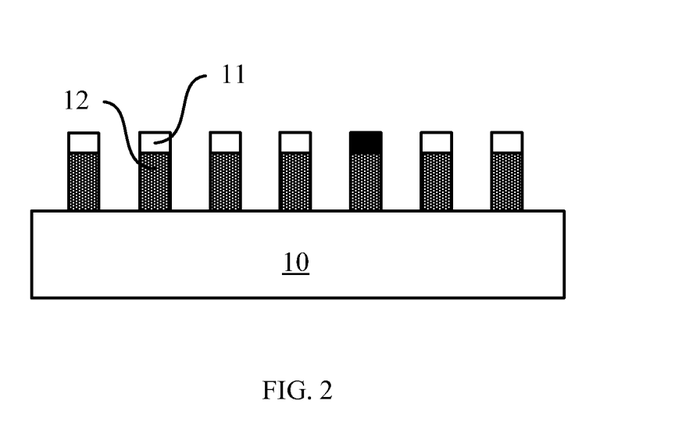
Figure 3:
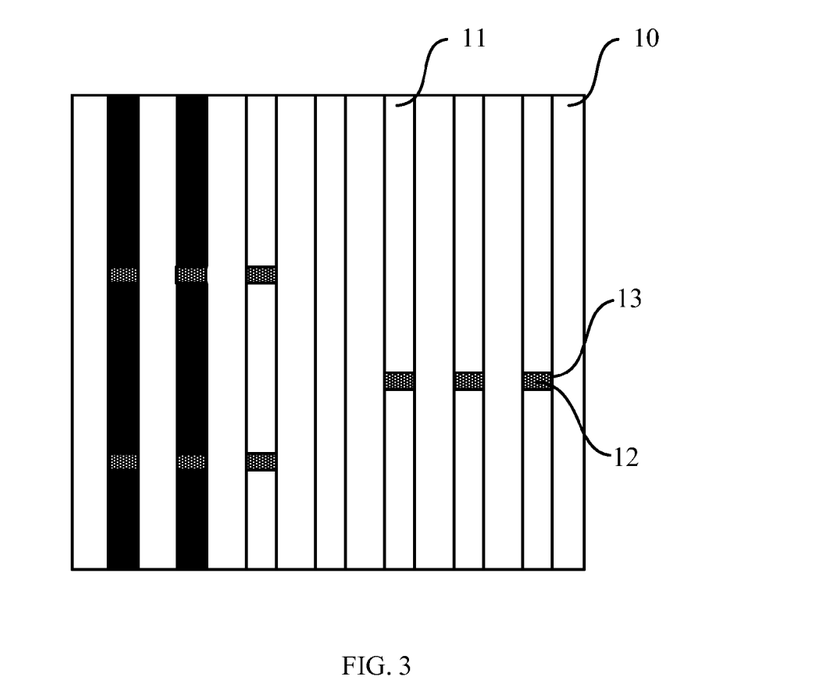
Figure 4:
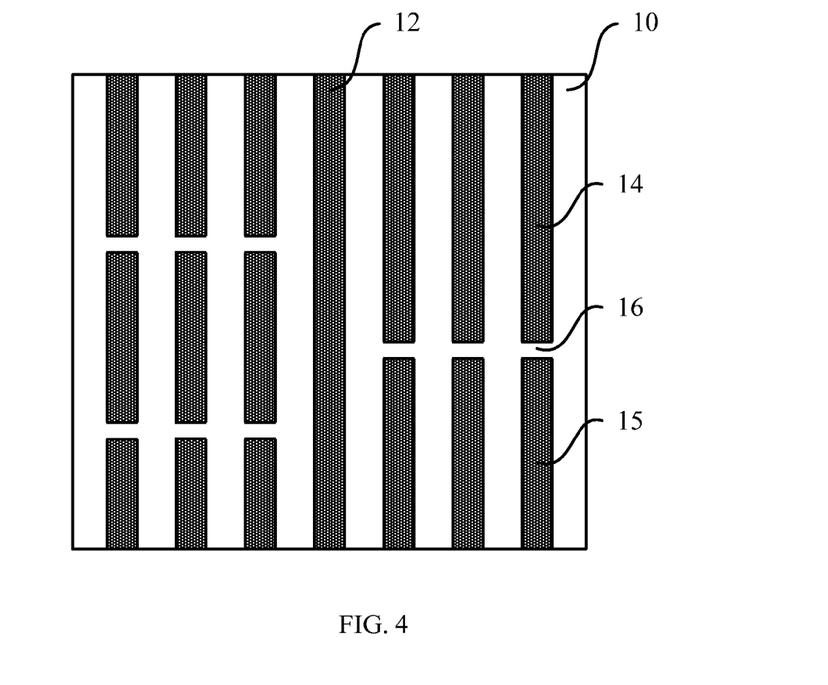

FIG. 1 illustrates part of a semiconductor structure with gates formed by way of Line-and-Cut technology in the prior art. As shown in FIG. 1, first, a substrate 10 with a gate material layer formed thereon in advance is overlaid with a photoresist layer 11; then, the photoresist layer 11 is exposed and developed with a mask in order to pattern the photoresist layer 11 whereby a linear pattern, which corresponds to a gate line pattern, is outlined. Next, the gate layer is etched to form gate lines 12 (the structure shown in FIG. 1 is the structure formed after the gate layer is already etched). With reference to FIG. 2, which illustrate a cross-sectional view of the semiconductor structure shown in FIG. 1 in the A-A direction, the gate lines 12 are laid out on the substrate 10, and the upper plane of the gate lines are overlaid with the photoresist layer 11. Next, with reference to FIG. 3, another exposure process is performed with a cut mask in order to form openings 13 on the photoresist layer 11, wherein the openings 13 expose the gate lines 12. The gate lines 12 are etched via the openings 13, by which the gate lines 12 can be cut. With reference to FIG. 4, in which the photoresist 11 is already removed, after the gate lines 12 are etched via the openings 13, the photoresist 11 and part of the gate lines 12 are removed to form cuts 16, wherein the gate lines 12 are cut into electrically isolated gates by the cuts 16, for example, the electrically isolated gates 14 and 15 shown in FIG. 4.

However, aforementioned traditional process is subject to following shortcomings: first, the above technique of lithography is subject to such rigid requirements that the distance between ends has to be extremely precise. Particularly, it becomes increasingly difficult to implement such a gate line patterning process along with development of downscaling size in devices. In order to increase integration density, manufacturing of the cut mask, which is used in formation of cuts that are required to be slim enough, would also become increasingly difficult. Additionally, application of the above-mentioned technique would become more complicated in gate replacement and high K dielectric processes. A process of sidewall spacer dual patterning may be required in a technical node below 22 nm.

For example, the width of the openings 13 in the direction of gate width can be as small as 30 nm~50 nm because of limitations from technical conditions in the prior art, consequently, the width of cuts 16, which are formed via the openings 13, in the direction of gate width is also in the range of 30 nm~50 nm. In other words, the minimal distance between the ends of two neighbouring electrically isolated gates that are located on the same line is 30 nm. With further development of semiconductor manufacturing technology, for example, in the 45 nm process, the distance between the ends of two neighbouring electrically isolated gates located on the same line is desired to be further reduced for the purpose of achieving a higher integration density. However, due to limitations of current technical conditions, no process in the prior art is capable of further reducing the distance between the ends of two neighbouring electrically isolated gates located on the same line to below 30 nm, which therefore becomes an issue that needs to be solved in order to increase integration density.

In addition, in the subsequent processes, sidewall spacers that surround the gates usually have to be formed on both sides of the electrically isolated gates. Due to the existence of the cuts 16, at the time of forming sidewall spacers, material for forming sidewall spacers, on the one hand, deposits on both sides of the gates and, on the other hand, flows into the cuts 16. As the cuts 16 are very narrow, the sidewall spacer material is prone to form defects such as hallows in the cuts, which is adverse to the subsequent processing of semiconductor devices, particularly, short-circuit is prone to occur at the time of forming metal plugs subsequently. In addition, if the gates are dummy gates, then these hallows would cause problems such as short circuit at the time of forming replacement gates subsequently. This undermines performance and stability of semiconductor devices.

SUMMARY OF THE INVENTION

The present invention is intended to provide a semiconductor structure and a method for manufacturing the same, which can suppress occurrence of defects at the time of forming gates of semiconductor structures and thereby facilitate further subsequent processing of the semiconductor structures.

In one aspect, the present invention provides a method for manufacturing a semiconductor structure comprising:
a) forming gate lines extending in a direction on a substrate;
b) forming a photoresist layer, with which the semiconductor structure is overlaid, and patterning the photoresist layer to form openings across the gate lines;
c) narrowing the openings by forming a self-assembly copolymer inside the openings; and
d) cutting the gate lines via the openings to make the gate lines insulated at the openings.

Accordingly, the present invention further provides a semiconductor structure, which comprises:
a substrate;
gate lines extending in a direction that are formed on the substrate, and sidewall spacers formed on both sides of the gate lines; and insulation regions that isolate neighbouring gate lines in said direction, wherein the width of the insulation regions in said direction is less than 30 nm.

Through forming an additional layer on the inner wall of the openings of the photoresist layer, the method for manufacturing a semiconductor structure provided by the present invention manages to reduce the distance between the two opposite walls of the openings in the direction of gate width. The method also manages to reduce the distance between the ends of electrically isolated neighbouring gates located on the same line where it is unnecessary to manufacture a cut mask whose lines are extremely fine. The working area is therefore saved, which accordingly improves integration level of semiconductor devices.

In addition, as compared to the Line-and-Cut dual patterning technology in the prior art, the semiconductor structure and the method for manufacturing the same provided by the present invention do not require formation of cuts on gate lines; instead, an insulating layer is formed in the direction of gate length by way of ion implanting so as to form electrically isolated gates, which in essence does not physically cut the gate lines but keep the gate lines intact. The process as such would not give rise to defects as the prior art does but facilitate subsequent processes, which accordingly ensures quality of semiconductor devices.

BRIEF DESCRIPTION OF THE DRAWINGS

Other additional features, aspects and advantages of the present invention are made more evident according to perusal of the following detailed description of exemplary embodiment(s) in conjunction with the appended drawings.

The same or similar reference signs in the drawings denote the same or similar elements.

DETAILED DESCRIPTION OF THE INVENTION

Here below, the embodiments of the present invention are to be described at length in conjunction with the appended drawings in order to make the objects, technical solutions and the advantages of the present invention more evident.

Embodiments of the present invention are to be described at length below, wherein examples of embodiments are illustrated in the drawings, in which throughout same or similar reference signs denote same or similar elements or elements with same or similar functions. It should be appreciated that embodiments described below in conjunction with the drawings are illustrative, and are provided for explaining the present invention only, thus they shall not be interpreted as limitations to the present invention.

Various embodiments or examples are provided here below to implement different structures of the present invention. To simplify the disclosure of the present invention, descriptions of components and arrangements of specific examples are given below. Of course, they are illustrative only and do not aim to limit the present invention. Moreover, in the present invention, reference numbers and/or letters may be repeated in different examples. Such repetition is for purposes of simplicity and clarity, which on its own does not denote any relationship between respective embodiments and/or arrangements under discussion. Furthermore, the present invention provides various examples for specific processes and materials. However, it is apparent for a person of ordinary skills in the art that other processes and/or materials may be alternatively utilized. In addition, structures where a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. Diagrams of layer structures according to the embodiments of the present invention are illustrated in the appended drawings. These drawings are not readily drawn to scale. Some details are enlarged, while some details are omitted for the purpose of clarity. The various regions, shapes of the layers and relative size and position of them are illustrative only and are not drawn to scale. Additionally, deviation may happen due to the margin of tolerance in manufacturing or technical limitation; besides, those skilled in the art may further design regions/layers with different shape, size and relative position according to needs in practice.

The preferred embodiments of the present invention are to be described in conjunction with the method for manufacturing a semiconductor structure provided by the present invention.

Figure 5:
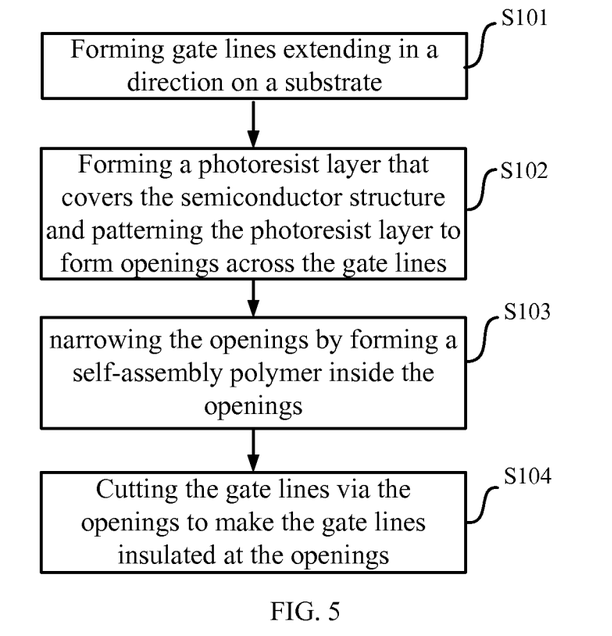
FIG. 5 illustrates a flowchart of an embodiment of a method for manufacturing a semiconductor structure provided by the present invention.

With reference to FIG. 5, which illustrates a flowchart of an embodiment of a method for manufacturing a semiconductor structure provided by the present invention, the method comprises:

Step S101 of forming gate lines extending in a direction on a substrate;

Step S102 of forming a photoresist layer overlaying the semiconductor structure, and patterning the photoresist layer to form openings across the gate lines;

Step S103 of narrowing the openings by forming a self-assembly copolymer inside the openings;

Step S104 of cutting the gate lines via the openings to make the gate lines insulated at the openings.

With reference to FIG. 6 to FIG. 9, the step S101 is performed to form gate lines 210 extending in a direction on the substrate 100. FIG. 6 to FIG. 9 illustrate views of the semiconductor structure at respective directions in the process of forming gate lines 210 according to the method for manufacturing a semiconductor structure provided by the present invention. First, with reference to FIG. 6, a gate stack layer 200 and a photoresist layer 201 are formed on the substrate 100. Wherein the substrate 100 includes Si substrate (e.g., wafer). According to the design requirements commonly known in the prior art (e.g., P-type substrate or N-type substrate), the substrate 100 may include various doping configurations. The substrate 100 in other embodiments may further include other base semiconductors, for example, Ge. Alternatively, the substrate 100 may include a compound semiconductor, for example, SiC, GaAs, InAs or PIn. Typically, the thickness of the substrate 100 may be, but is not limited to, hundreds of micrometers, which for example is in the range of 400 μm-800 μm. According to the needs of design, the substrate 100 may selectively be bulk Si or Silicon on insulator (SOI). A shallow trench isolation structure may be formed on the substrate in advance, and the shallow trench isolation structure segments the surface of the substrate into discrete active regions.

Figure 6:
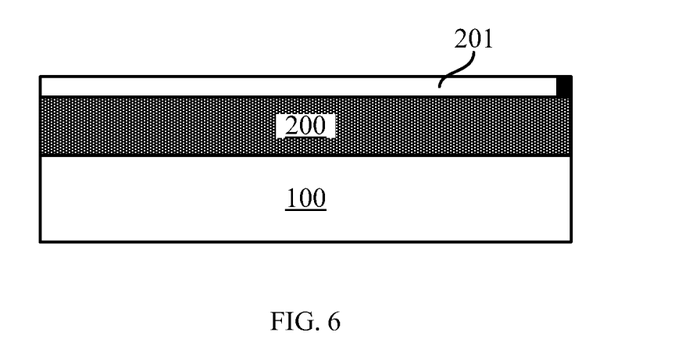
FIG. 6 to FIG. 22 illustrate respectively views of a semiconductor structure manufactured at respective stages according to an embodiment of the method for manufacturing a semiconductor structure as illustrated in FIG. 5.

The material for the photoresist layer 201 may be a vinyl monomer material, a material containing nitrine quinone compound or a polyethylene lauric acid material; of course, other materials as appropriate may be used selectively according to manufacturing needs in practice.

Figure 7:
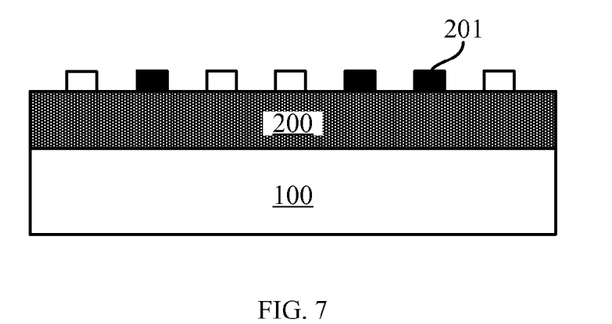
Figure 8:
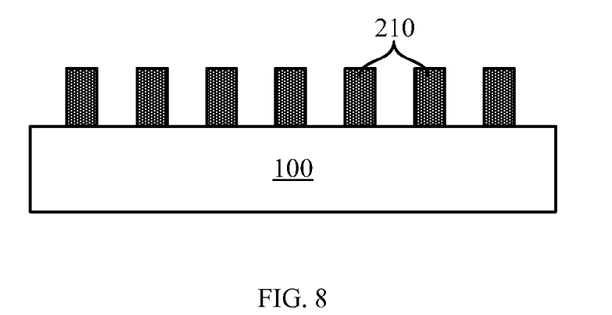
Figure 9:
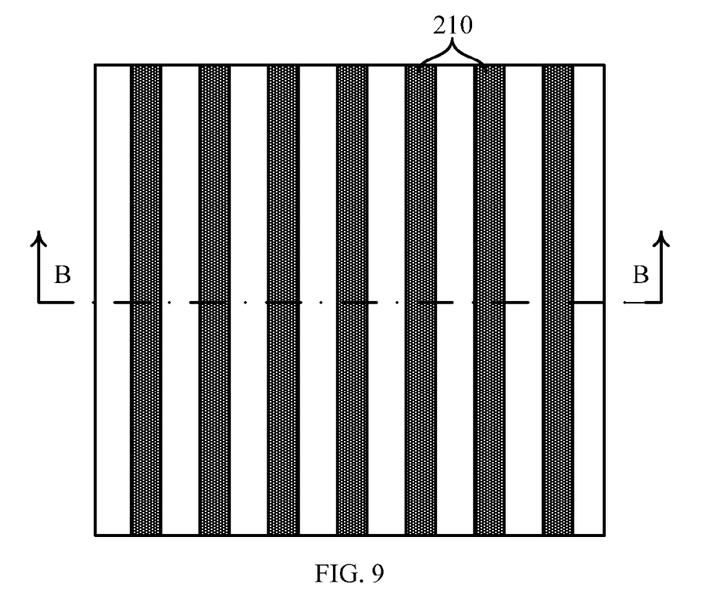

The gate lines 210 extending in a direction (the direction perpendicular to the paper shown in FIG. 8) are resulted from patterning and etching photoresist laid on the gate stack layer 200. First, the photoresist layer 300 (原文 中有误, 应为 201) is exposed and developed with a mask to expose the gate stack layer 200 and to outline a linear pattern corresponding to the pattern of gate lines 210 to be formed subsequently, as shown in FIG. 7. Next, the gate stack layer 200 is further etched to form gate lines 210, and then the photoresist layer 201 is removed, as shown in FIG. 8. Since the gate lines 210 are formed with the gate stack, which comprises a gate dielectric layer and a laminated structure of a gate material layer laid on the gate dielectric layer, therefore, the gate dielectric layer in the gate stack is located at the base layer next to the substrate 100. Usually, the material for the gate dielectric layer may be a thermal oxide layer, which includes $SiO_2$ or $Si_2N_2O$, or may be a high K dielectric, for example, any one selected from a group consisting of $HfO_2$, HfSiO, HfSiON, HfTaO, HfTiO, HfZrO, $Al_2O_3$, $La_2O_3$, $ZrO_2$, LaAlO and combinations thereof, with a thickness in the range of 1 nm~4 nm. The gate material layer may be any one selected from a group consisting of Poly-Si, Ti, Co, Ni, Al, W, alloy, metal silicide and combinations thereof. In some embodiments, the gate material layer my be in a multi-layer structure, which for example is formed through laminating a gate metal layer and a gate electrode layer; wherein the material for the gate metal layer may be any one selected from a group consisting of TaC, TiN, TaTbN, TaErN, TaYbN, TaSiN, HfSiN, MoSiN, $RuTa_x$, NiTa and combinations thereof, with a thickness in the range of 5 nm~20 nm; Poly-Si may be selected as the material for the gate electrode layer 203, whose thickness is in the range of 20 nm~80 nm. Optionally, the gate stack may further comprise at least one layer of dielectric layer that covers the gate material layer for the purpose of protecting other structures of the gate stack located under it. Turn to refer to FIG. 9, the structural diagram of a semiconductor structure shown in FIG. 8 is a cross-sectional structural view along B-B direction of the bird's-eye view of a semiconductor structure shown in FIG. 9. As shown in FIG. 9, the gate lines 210 extend in the direction parallel to the paper length direction and are arranged parallel to each other with equal spacing. In other embodiments, the size of the gate lines, the extending direction and the spacing between the gate lines may be determined according to requirements for designing semiconductor devices.

Figure 10:
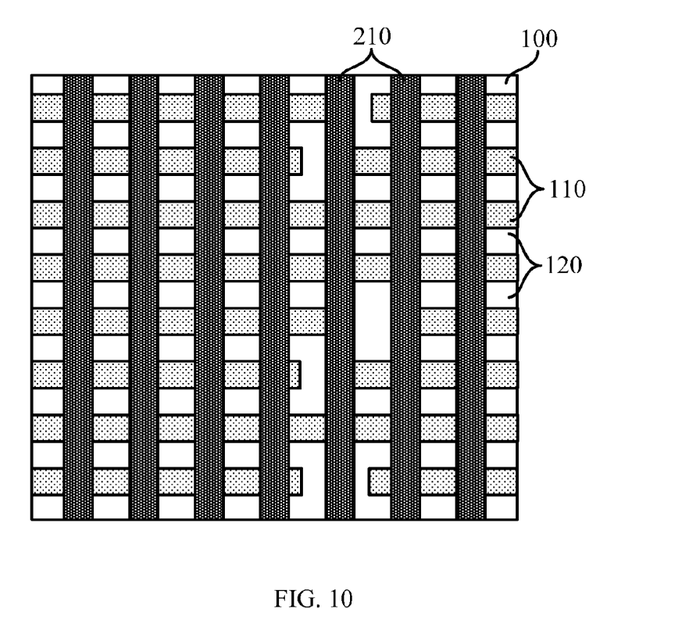

With reference to FIG. 10, after the gate lines 210 are formed through patterning the gate stack layer 200, the active regions 110 and the shallow trench isolation structures 120 beneath are exposed. Optionally, source/drain regions may be formed in the active regions 110. Formation of source/drain regions may include steps of forming firstly source/drain extension regions on both sides of the gate lines, and then forming sidewall spacers on sidewalls of the gate lines, and finally forming source/drain regions on both sides of sidewall spacers. Since the process for forming source/drain extension regions, sidewall spacers and source/drain regions are widely known in the art, thus are not delineated here in order not to obscure.

In the present embodiment, neither source/drain regions nor sidewall spacers are formed at this moment, and forthcoming description is given on such basis.

Figure 11:
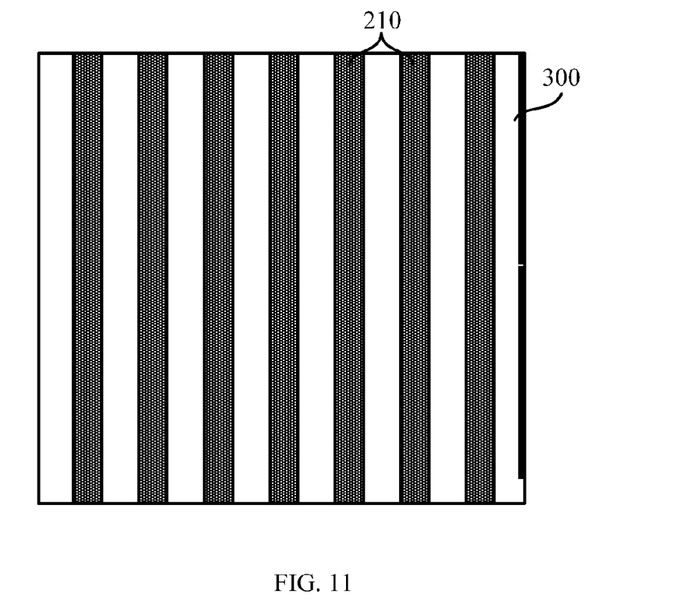
Figure 12:
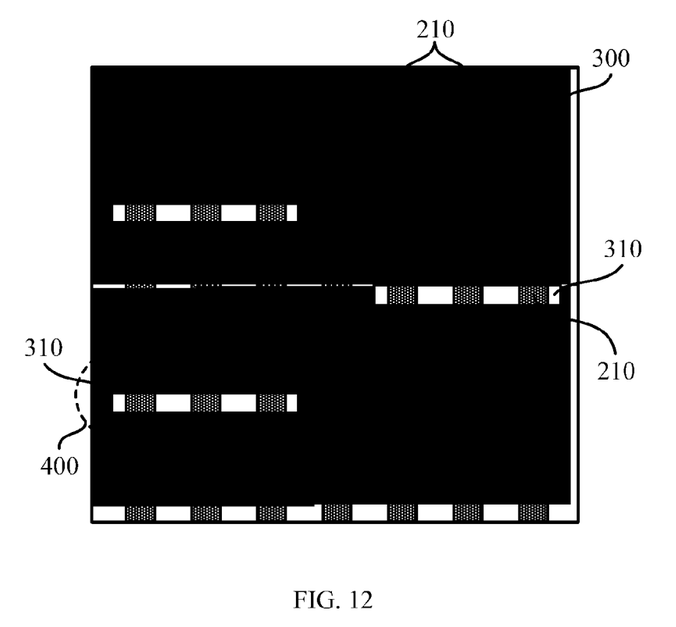

With reference to FIG. 11 and FIG. 12, the step S102 is performed to form a photoresist layer 300 that covers the semiconductor structure; then the photoresist layer 300 is patterned to form openings 310 across the gate lines.

Usually, the material for the photoresist layer 300 may be a vinyl monomer material, a material containing nitrine quinone compound or a polyethylene lauric acid material. As shown in FIG. 11, the photoresist layer 300 is formed on the entire semiconductor structure; namely, it covers the gate lines 210 and the substrate 100 on both sides thereof. However, it should be appreciated that aforementioned term "cover" should be interpreted as: in some embodiments, the photoresist layer 300 is laid directly on the gate lines 210 and the substrate 100 on both sides thereof; in other embodiments, since another structure such as a epitaxial strained layer has already been formed to cover the gate lines 210 and the substrate 100 on both sides thereof with regard to manufacturing needs, therefore, the photoresist layer 300 covers the epitaxial strained layer directly. Accordingly, there may be some other structures presented between the photoresist layer 300 and the gate lines 210 and the substrate 100; in this case, it is viable to apply the photoresist layer 300 above the gate lines 210 and the substrate 100 only for the purpose of patterning.

With reference to FIG. 12, the openings 310 across the gate lines are formed on the photoresist layer 300. The openings 310 expose the gate lines 210 under embodiments that the photoresist layer 300 covers the gate lines directly. In the present embodiment, the openings 310 shown in FIG. 12 expose a plurality of gate lines 210, such that the gate lines 210 are cut on the same line. In other embodiments, the openings 310 may expose only one gate line 210, wherein the position of the openings 310 shown in FIG. 12 is exemplary only. Preferably, whenever a shallow trench isolation structure 120 has already been formed on the substrate 100, the openings 310 are usually formed above the shallow trench isolation structure 120 only if design requirements are satisfied; therefore, the layout like this is favorable for saving area and enhancing integration. Additionally, the relative distance of openings 310 to two adjacent walls is made less than 50 nm in the gate width direction, which also is favorable for saving area and enhancing integration.

In this case, the step S103 is performed to form a self-assembly copolymer within the openings to narrow the openings.

Figure 13:
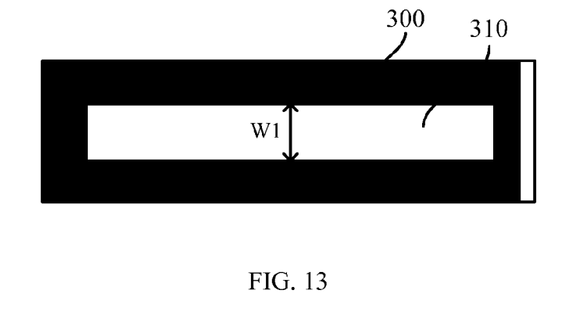

Because the openings 310 are to be further processed in subsequent steps, thus FIG. 13 is to be referred to in order to delineate more explicitly the technical solution of the present invention; FIG. 13 illustrates a partly enlarged view of an opening 310 inside the region 400 shown in FIG. 12, wherein W1 represents the relative distance of the openings to two walls in the gate width direction. During the process of lithography, the size of openings 310 may be subject to limitation from technical difficulties, thus W1 may be in a range of, for example, 30 nm≤W1≤50 nm.

Figure 14:
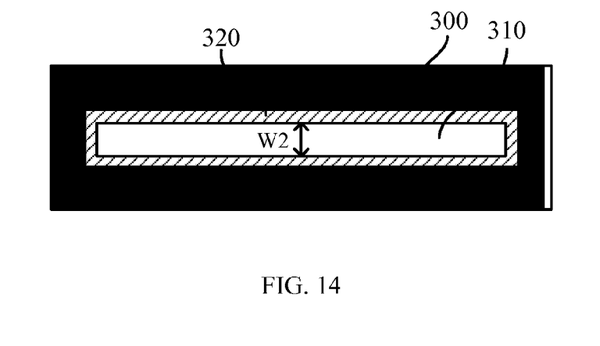

With reference to FIG. 14, which illustrates a structural diagram after formation of an additional layer 320 onto inner walls of the openings 310 as shown in FIG. 13. As mentioned in the foregoing text, the material for the photoresist layer 300 may be preferably photoresist; accordingly, the material for the inner walls of the openings 310 is also photoresist. It is applicable to grow a self-assembly copolymer material onto the inner walls of the openings 310, while the grown self-assembly copolymer forms the additional layer 320. Namely, the additional layer 320 is the self-assembly copolymer layer 320. Description of growing a self-assembly copolymer material onto a photoresist layer may be referred to from the thesis titled "Self-Assembling Materials for Lithographic Patterning: Overview, Status and Moving Forward", which was published on Alternative Lithographic Technologies II, issue 7637, under the International Society for Optical and Photonics (SPIE). Aforementioned thesis has already specified how to grow a self-assembly copolymer material onto a photoresist in a part named Self-Assembly of Block Copolymer. Due to characteristics of the self-assembly copolymer, self-assembly copolymer can grow on all exposed photoresist. For purposes of simplicity and explicitness, FIG. 14 merely illustrates the self-assembly copolymer grown at such a critical position as the inner walls of the openings 310, so as to show clearly its positional relationship to the openings 310.

After formation of the self-assembly copolymer layer 320 on the inner walls of the openings 310, the relative distance of the opening 310 to two walls in the gate width direction changes to W2, wherein W2<W1, since the self-assembly copolymer 320 has a thickness to certain extent. Usually, W2 is less than 30 nm, for example, less than 20 nm or even less than 10 nm. Therefore, after the inner walls of the openings 310 is overlaid with the self-assembly copolymer layer 320, the relative distance of openings 310 to two walls is the gate width direction is further shortened.

Figure 15:
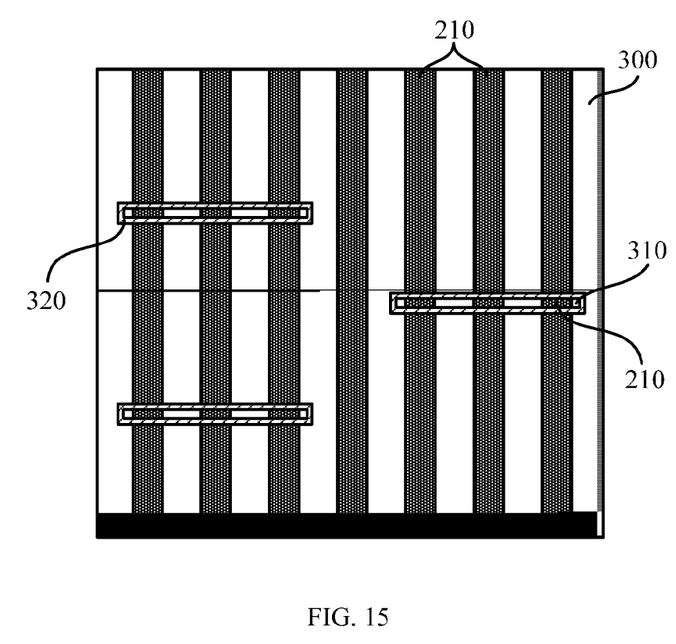
Figure 16:
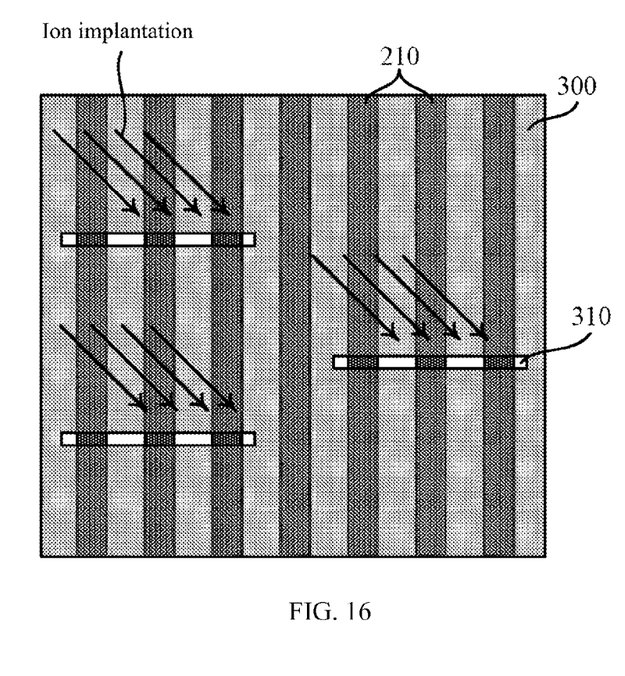

With reference to FIG. 15, the inner walls of the openings 310 are covered by the self-assembly copolymer 320, therefore, the area of the exposed gate lines 210 becomes smaller than that before formation of the self-assembly copolymer 320. Formation of an additional layer onto the inner walls of the openings on the photoresist layer reduces the relative distance of the openings to two walls in the gate width direction, namely, reduces the distance between the ends of electrically isolated neighboring gates that are positioned on the same line, which therefore saves area and enhances integration of semiconductor devices.

Figure 17:
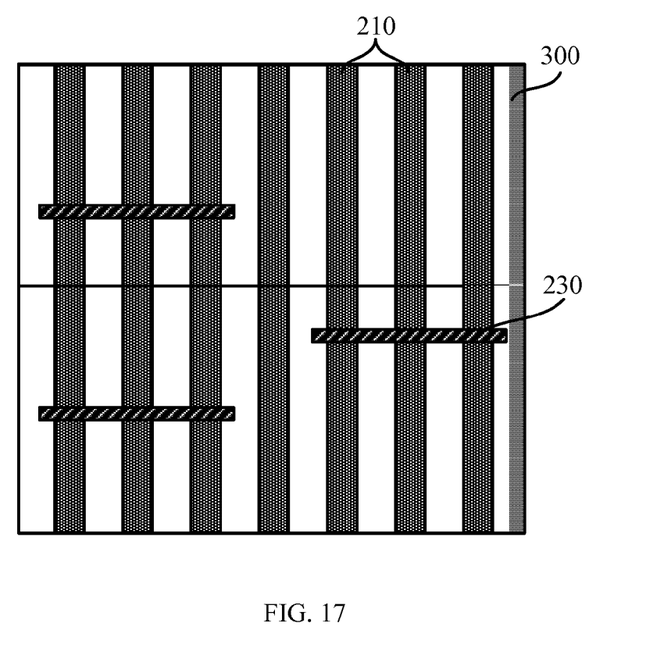
Figure 18:
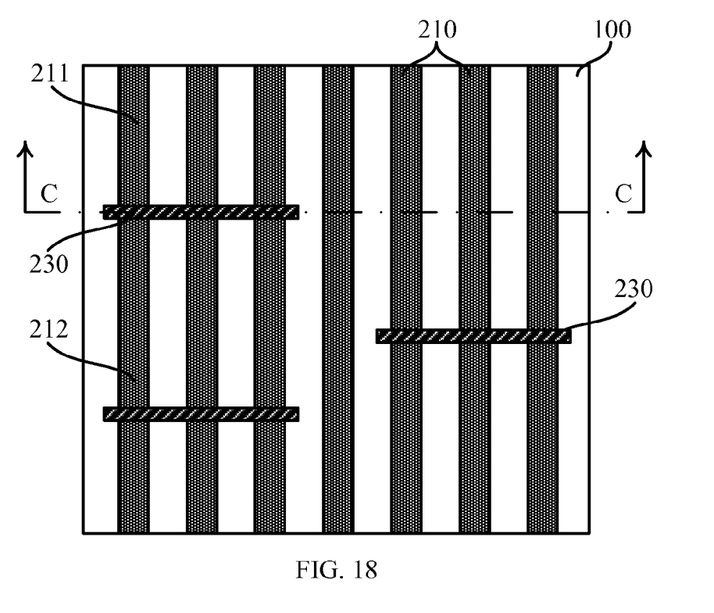
Figure 19:
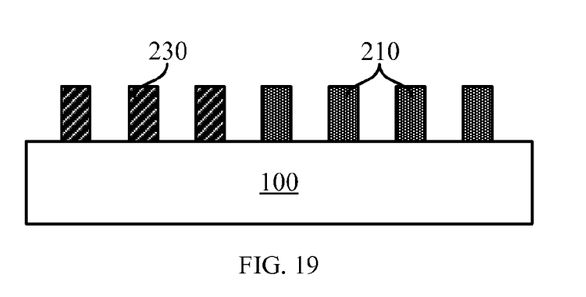

Next, with reference to FIG. 16 to FIG. 19, the step S104 is implemented; the gate lines are insulated at the openings through cutting the gate lines via the openings. Specifically, in the present embodiment, ions are implanted into the gate lines 210 via the openings 310, such that the gate lines 210 become insulated at the openings. The gate lines may be cut at the openings 310 by way of etching, laser ablation or the like. In the present embodiment, ion implantation is performed via the openings 310 to enable reaction of the exposed gate line 210 so as to form an insulating layer 230. The insulating layer 230 cuts the gate lines 210 in the direction of gate length to enable the gate lines 210 to form electrically isolated gates. First, with reference to FIG. 16, ions are implanted via the openings 310, wherein ions to be implanted are usually oxygen ions, since implantation of oxygen ions enables the exposed gate lines 210 to be oxidized, and the oxide resulted from oxidizing the gate lines 210 is insulating. With reference to FIG. 17, the insulating layer 230 is formed after ion implantation. Take oxygen ion implantation as an example. The insulating layer 230 is composed of oxides resulted from reaction between the exposed gate lines 210 and oxygen ions, such as $SiO_2$, metal oxide or the like (which depends on the material of the gate stack). With reference to FIG. 18, the photoresist layer 300 may be removed after the insulating layer 230 is formed for the purpose of facilitating subsequent process. The insulating layer 230 cuts the gate lines 210 in the gate length direction so as to segment the gate lines 210 into electrically isolated gates, such as electrically isolated gate 211 and gate 212 shown in FIG. 18. However, it should be noted that the openings 310 in the present embodiment expose no only a plurality of the gate lines 210 but also part of the substrate 100. Nonetheless, since the openings are usually located above the shallow trench isolation structure, therefore, the active regions would not be oxidized by the oxygen ions implanted. Turn to refer to FIG. 19 in order to further specify the position for forming the insulating layer 230; FIG. 19 illustrates a cross-sectional structural view of a semiconductor structure along the C-C direction shown in FIG. 18. According to the characteristic of oxygen ion implantation, energy of oxygen ions is brought under control using an electrical field, such that the gate lines 210 are oxidized thoroughly from surface to center to form the insulating layer 230. As shown in FIG. 19, the insulating layer 230 is located on the sectional face of the gate lines 210 and electrically segments an entire gate line 210 into two sections; namely, the gate lines 210, which would have formed conductive, now become open because the exposed portions thereof have been oxidized by oxygen ions, but the gate lines 210 are still maintained their shape intact. It is unnecessary to break the physical shape of the gate lines or to form any physical cut; and that is the place where the present invention differs from the prior art.

Figure 20:
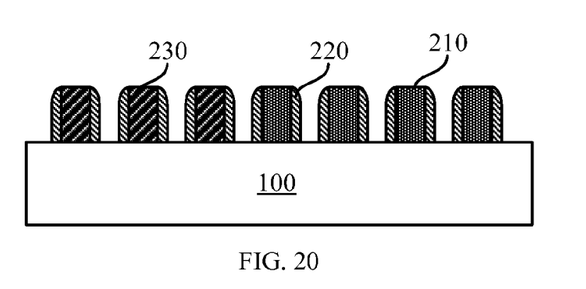
Figure 21:
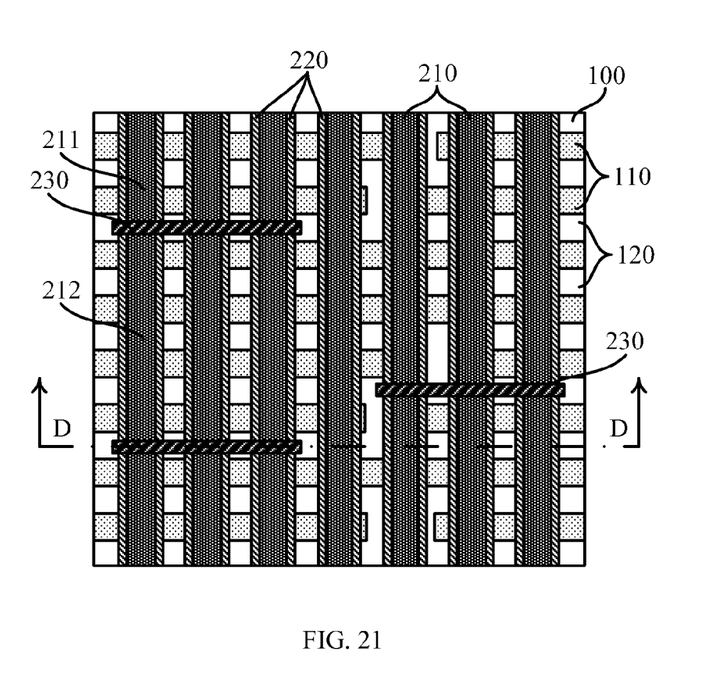

After formation of the insulating layer 230, the semiconductor structure may be further processed, as shown in FIG. 20. Sidewall spacers 220 around the gates lines 210 are formed on both sides of the gate lines 210; the sidewalls spacers 220 may be formed with $Si_3N_4$, $SiO_2$, $Si_2N_2O$, SiC and/or other materials as appropriate. The sidewall spacers 220 may be in a multi-layer structure. The sidewall spacers 220 may be formed through depositing-etching process, with a thickness in the range of about 10 nm-100 nm. FIG. 20 illustrates a cross-sectional structural diagram of the semiconductor structure in the D-D direction shown in FIG. 21. With reference to FIG. 21, the sidewall spacers 220 are formed on both sides of the gate lines 210, i.e., on both sides of the gate 211 or the gate 212, for the purpose of protecting the gates. Source/drain extension regions may be formed on both sides of the gates before the sidewall spacers are formed. Then, after formation of sidewall spacers, source/drain regions may be formed outside the sidewall spacers, which are not delineated here in order not to obscure.

Figure 22:
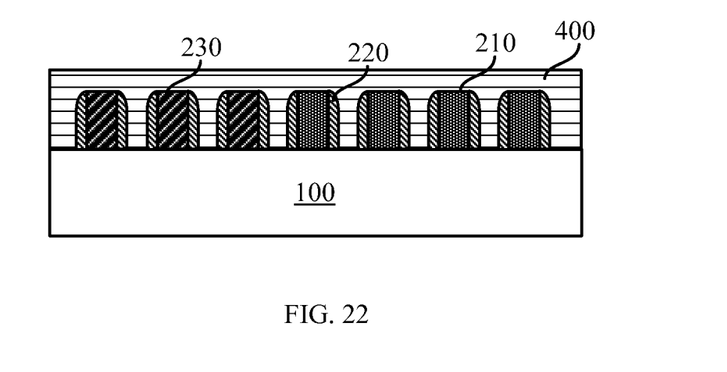

Additionally, according to design requirements of semiconductor structures, at least one layer of a strained layer 400 may be formed to cover the gate lines 210, the sidewall spacers 220 and the substrate 100 after formation of the sidewall spacers 220; the strained layer is provided for the purpose of increasing stress so as to enhance performance of semiconductor devices, as shown in FIG. 22.

Figure 23:
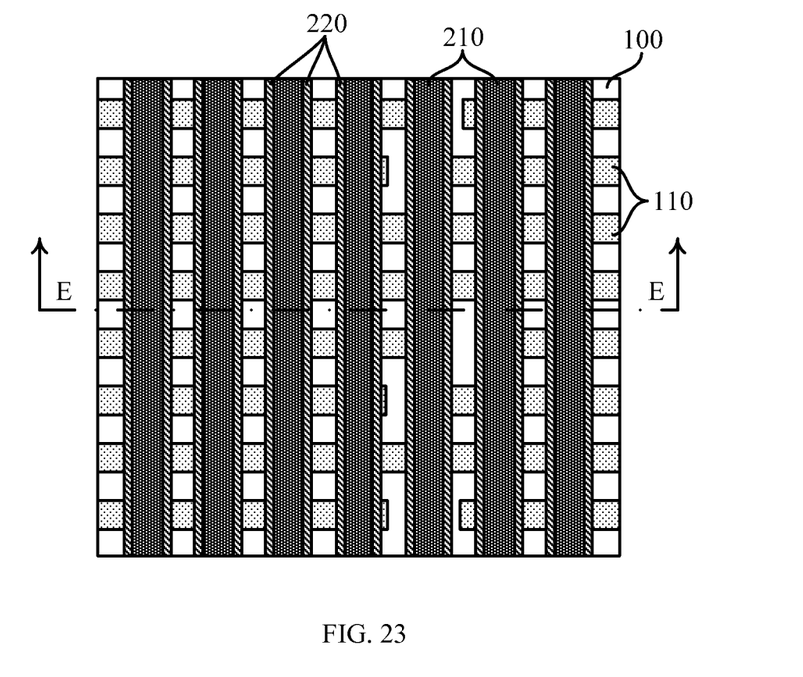
FIG. 23 to FIG. 25 illustrate respectively views of a semiconductor structure manufactured at respective stages of forming sidewall spacers and source/drain regions according to another embodiment provided by the present invention.
Figure 24:
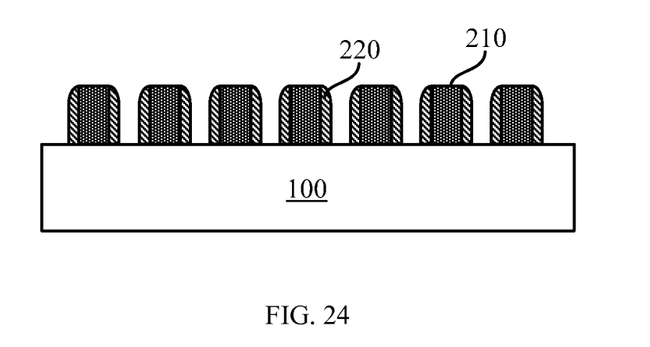
Figure 25:
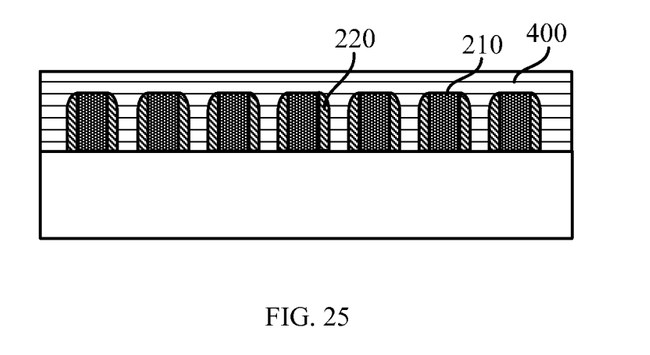

Optionally, it is applicable to first form the sidewall spacers 220 and at least one layer of the strained layer 400, and then to form the insulating layer 230. Namely, the step of forming the insulating layer 230 may be implemented at last. With reference to foregoing specific embodiments, patterns composed of the gate lines 210 shown in FIG. 10 are formed at first; next, the semiconductor structure shown in FIG. 23 is formed, namely, to form source/drain extension regions, sidewall spacers 220 and source/drain regions on both sides of the gate lines 210. FIG. 24 illustrates a cross-sectional diagram of the semiconductor structure in the E-E direction as shown in FIG. 23; at least one layer of the strained layer 400 that covers the gate lines 210, the sidewall spacers 220 and the substrate 100 may be formed at next step, as shown in FIG. 25. Then, the step of forming the insulating layer 230 is implemented. In the present embodiment, the processes for forming the sidewall spacers 220 and forming the strained layer 400 may be referred to from related parts of the foregoing description of the specific embodiments, and the process of forming the insulating layer 230 also may be referred to from foregoing specific embodiments. However, it should be noted because the gate lines 210 are covered by the strained layer 400 in the present embodiment, therefore, the openings 310 formed on the photoresist layer 300 expose the strained layer 400 on the gate lines 210 in some embodiments. Accordingly, energy and dosage of oxygen ions to be implanted should be adjusted so as to enable oxygen ions to penetrate the strained layer 400 and to oxidize thoroughly the gate lines 210 under the strained layer 400.

With respect to the technical solution of the present invention, the step of forming the insulating layer 230 may be implemented after the step of forming the sidewall spacers 220 or after both steps of forming the sidewall spacers 220 and forming the strained layer 400 (usually, the strained layer 400 is formed after formation of the sidewall spacers 220), or may be implemented before formation of sidewall spacers 220 and the strained layer 400. Therefore, manufacturing steps are not subject to a strict order, and a variety of manufacturing procedures may be provided. Nonetheless, it is noteworthy that the step of forming the insulating layer 230 (i.e. forming electrically isolated gates) should precede the step of forming contact plugs that are in contact with source/drain regions.

No matter whichever aforementioned procedure of a method for manufacturing a semiconductor structure provided by the present invention is carried out, the step of forming the insulating layer 230 may be followed by such steps as: forming at least one layer of dielectric layer that covers the gate lines, the sidewall spacers and the source/drain regions (if a strained layer 400 has already been formed in the semiconductor structure, then said at least one layer of dielectric layer also covers the strained layer 400), arranging contact plugs, which are embedded within said at least one layer of dielectric layer, to be electrically connected with source/drain regions 100 and/or the gates. The at least one layer of dielectric layer may be formed on the substrate 100 by means of Chemical-Vapor Deposition (CVD), High-Density Plasma CVD or other processes as appropriate. The material for the dielectric layer may be any one selected from a group consisting of $SiO_2$, carbon-doped $SiO_2$, BPSG, PSG, USG, $Si_2N_2O$, a low k material and combinations thereof. The material for the contact plugs may be any one selected from a group consisting of W, Al, TiAl alloy and combinations thereof.

As compared to the Line-and-Cut dual patterning technology in the prior art, the present invention has proposed to provide a semiconductor structure and a method for manufacturing the same in which an insulating layer is formed in the length direction of gates through ion implanting instead of forming cuts on gate lines, so as to form electrically isolated gates; this process neither causes damage to the physical shape of the gate lines 210 nor forms any physical cut; instead, the gate lines 210 remain intact. Such processes would not give rise to defects, to which the prior art is subject, when forming a dielectric layer at subsequent steps, which therefore facilitates subsequent process and ensures performance of semiconductor devices. In addition, formation of the insulating layer 230 is free from limitation of formation of sidewall spacers 220 and the strained layer 400. Therefore, manufacturing steps are not subject to a strict order and a variety of manufacturing procedures may be provided, which can satisfy many more scenarios in practice.

A preferred structure of the semiconductor structure provided by the present invention is to be described here below. Turn to refer to FIG. 20 and FIG. 21, wherein FIG. 21 illustrates a bird's-eye view of an embodiment for a semiconductor structure of the present invention. In the preferred embodiment, the semiconductor structure comprises:

a substrate 100;

gate lines 210 extending in a direction, which are formed on the substrate; and sidewall spacers 220 formed on both sides of the gate lines;

insulating regions 230, which isolate the neighboring gate lines 210 in said direction, wherein the width of the insulating regions 230 in said direction is less than 30 nm, preferably less than 20 nm, or more preferably less than 10 nm.

Wherein, the substrate 100 includes Si substrate (e.g. wafer). According to design requirements in the prior art (e.g. a P-type substrate or an N-type substrate), the substrate 100 may be of various doping configurations. The substrate 100 in other embodiments may further include other basic semiconductors, for example, germanium. Alternatively, the substrate 100 may include a compound semiconductor, such as SiC, GaAs, InAs or InP. Typically, the substrate 100 may have, but is not limited to, a thickness of around several hundred micrometers, which for example may be in the range of 400 μm-800 μm. There may be a shallow trench isolation structure 120 formed on the substrate 100; the shallow trench isolation structure 120 segments the surface of the substrate 100 into discrete active regions 110.

The gate line 210 is a gate stack, which comprises a gate dielectric layer and a laminated structure of a gate material layer laid on the gate dielectric layer, therefore, the gate dielectric layer in the gate stack is located at the base layer next to the substrate 100. Usually, the material for the gate dielectric layer may be a thermal oxide layer, which includes $SiO_2$ or $Si_2N_2O$, or may be a high K dielectric, for example, any one selected from a group consisting of $HfO_2$, HfSiO, HfSiON, HfTaO, HfTiO, HfZrO, $Al_2O_3$, $La_2O_3$, $ZrO_2$, LaAlO and combinations thereof, with a thickness in the range of 1 nm~4 nm. The gate material layer may be any one selected from a group consisting of Poly-Si, Ti, Co, Ni, Al, W, alloy, metal silicide and combinations thereof. In some embodiments, the gate material layer my be in a multi-layer structure, which for example is formed through laminating a gate metal layer and a gate electrode layer; wherein the material for the gate metal layer may be any one selected from a group consisting of TaC, TiN, TaTbN, TaErN, TaYbN, TaSiN, HfSiN, MoSiN, $RuTa_x$, NiTa and combinations thereof, with a thickness in the range of 5 nm~20 nm; Poly-Si may be selected as the material for the gate electrode layer, whose thickness may be in the range of 20 nm~80 nm. Optionally, the gate stack may further comprise at least one layer of dielectric layer that covers the gate material layer for the purpose of protecting other structures of the gate stack located beneath it. Usually, the size of the gate lines and the interval between gate lines may be determined according to requirements for designing semiconductor devices. Generally, the gate lines are arranged in parallel.

In addition, sidewall spacers 220 are formed on both sides of the gate lines and surround the gate lines. The sidewalls spacers 220 may be formed with $Si_3N_4$, $SiO_2$, $Si_2N_2O$, SiC and/or any other material as appropriate. The sidewall spacers 220 may be in a multi-layer structure. The sidewall spacers 220 may be formed through depositing-etching process, with a thickness in the range of about 10 nm-100 nm Source/drain regions may be formed within active regions 120 (原文有误, 应为110) on the substrate 100. Generally, source/drain regions are formed after formation of the gate lines 210.

The gate lines 210 are cut by the insulating layer 230 in the gate-length direction such that the gate lines 210 are segmented into electrically isolated gates, for example, the gate 211 and the gate 212. The gate 211 and the gate 212 are positioned on the same gate line 210 but are electrically isolated by the insulating layer 230. Usually, the material for the insulating layer 230 is an insulating material such as an oxide of the material for forming the gate stack (i.e. material for the gate lines), for example, $SiO_2$ and metal oxide, which is different from the material for the sidewall spacers 220. Noticeably, aforementioned process is different from isolating ends of neighboring gates by means of sidewall spacer material in the prior art. Preferably, the insulating layer 230 is formed above the shallow trench isolation structure 120, which is favorable for saving area and improving integration. At the gate-width direction, the thickness of the insulating layer 230 is less than 50 nm, for example 10 nm.

The insulating layer 230 is formed by means of ion implant, for example, implanting oxygen ions.

Turn to refer to FIG. 20 in order to further describe the structure of the insulating layer. FIG. 20 illustrates a cross-sectional structural diagram of the semiconductor structure in the D-D direction as shown in FIG. 21. As shown, the gate lines 210 are electrically isolated once they are cut by the insulating layer 230.

Optionally, as shown in FIG. 22, the semiconductor structure further comprises at least one layer of strained layer 400, which covers the gate lines 210, the sidewall spacers 220 and the source/drain regions, for the purpose of providing a stress so as to enhance performance of semiconductor devices.

Optionally, the semiconductor structure further comprises at least a layer of dielectric layer that covers the gate lines, the sidewall spacers and the source/drain regions (if a strained layer 400 has already been formed in the semiconductor structure, then the at least one layer of dielectric layer covers the strained layer 400); contact plugs that are embedded within the at least one layer of dielectric layer are electrically connected to the source/drain regions and/or the gates. The material for the at least one dielectric layer may be any one selected from a group consisting of $SiO_2$, carbon-doped $SiO_2$, BPSG, PSG, USG, $Si_2N_2O$, a low k material and combinations thereof. The material for the contact plugs may be any one selected from a group consisting of W, Al, TiAl alloy and combinations thereof.

It is noteworthy that, in addition to the semiconductor structure provided in aforementioned specific embodiment, the same semiconductor device may further comprise other semiconductor structures.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, comprising:
    a) forming gate lines extending in a direction on a substrate;
    b) forming a photoresist layer that covers the semiconductor structure and patterning the photoresist layer to form openings across the gate lines;
    c) narrowing the openings by forming a self-assembly polymer inside the openings; and
    d) cutting the gate lines via the openings to make the gate lines insulated at the openings wherein
    the step d) further comprises implanting ions into the gate lines via the openings to insulate the gate lines at the openings.

2. The method of claim 1, wherein:
    the ion implantation is an oxygen ion implantation.

3. The method of claim 1, wherein:
    the openings are located above a shallow trench isolation in the substrate.

4. The method of claim 1, wherein prior to implementation of the step b), further comprising:
    e) forming sidewall spacers on both sides of the gate lines.

5. The method of claim 4, wherein prior to implementation of the step b) and after implementation of the step e), further comprising:
    f) forming at least one strained layer that covers the gate lines and the sidewall spacers.

* * * * *